United States Patent
Hu et al.

(10) Patent No.: US 9,831,103 B2
(45) Date of Patent: Nov. 28, 2017

(54) MANUFACTURING METHOD OF INTERPOSED SUBSTRATE

(71) Applicant: Unimicron Technology Corp., Taoyuan (TW)

(72) Inventors: Dyi-Chung Hu, Hsinchu County (TW); Ming-Chih Chen, Hsinchu (TW); Tzyy-Jang Tseng, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 170 days.

(21) Appl. No.: 14/995,207

(22) Filed: Jan. 14, 2016

(65) Prior Publication Data
US 2016/0133483 A1    May 12, 2016

Related U.S. Application Data

(60) Division of application No. 14/164,245, filed on Jan. 26, 2014, now Pat. No. 9,282,646, which is a
(Continued)

(30) Foreign Application Priority Data

May 24, 2012   (TW) .............................. 101118578 A

(51) Int. Cl.
*H01L 21/48* (2006.01)
*C25D 7/12* (2006.01)
(Continued)

(52) U.S. Cl.
CPC .......... *H01L 21/4857* (2013.01); *C25D 1/003* (2013.01); *C25D 5/022* (2013.01);
(Continued)

(58) Field of Classification Search
CPC ......... H01L 21/4857; C25D 7/12; C25D 5/48; C25D 5/34; C25D 5/022; C25D 1/003;
(Continued)

(56) References Cited

U.S. PATENT DOCUMENTS

| 7,820,233 | B2* | 10/2010 | Chen ................... | C23C 18/1605 |
| | | | | 427/282 |
| 2007/0082501 | A1* | 4/2007 | Hurwitz .............. | H01L 21/4857 |
| | | | | 438/763 |

(Continued)

FOREIGN PATENT DOCUMENTS

| CN | 1507046 | 6/2004 |
| CN | 102157391 | 8/2011 |

OTHER PUBLICATIONS

"Office Action of China Counterpart Application", dated Feb. 5, 2015, p. 1-p. 6.

*Primary Examiner* — Louis Rufo
(74) *Attorney, Agent, or Firm* — JCIPRNET

(57) ABSTRACT

A manufacturing method of an interposed substrate is provided. A metal-stacked layer comprising a first metal layer, an etching stop layer and a second metal layer is formed. A patterned conductor layer is formed on the first metal layer, wherein the patterned conductor layer exposes a portion of the first metal layer. A plurality of conductive pillars is formed on the patterned conductor layer, wherein the conductive pillars are separated from each other and stacked on a portion of the patterned conductor layer. An insulating material layer is formed on the metal-stacked layer, wherein the insulating material layer covers the portion of the first metal layer and encapsulates the conductive pillars and the other portion of the patterned conductor layer. The metal-stacked layer is removed to expose a lower surface opposite
(Continued)

to an upper surface of the insulating material layer and a bottom surface of the patterned conductor layer.

13 Claims, 6 Drawing Sheets

Related U.S. Application Data continuation-in-part of application No. 13/543,893, filed on Jul. 9, 2012, now Pat. No. 8,952,268.

(51) Int. Cl.
    *C25D 5/48*     (2006.01)
    *C25D 5/34*     (2006.01)
    *C25D 5/02*     (2006.01)
    *H05K 1/11*     (2006.01)
    *H05K 3/46*     (2006.01)
    *C25D 1/00*     (2006.01)
    *H05K 3/10*     (2006.01)
    *H05K 3/42*     (2006.01)

(52) U.S. Cl.
    CPC ............... *C25D 5/34* (2013.01); *C25D 5/48* (2013.01); *C25D 7/12* (2013.01); *H05K 1/113* (2013.01); *H05K 3/10* (2013.01); *H05K 3/4647* (2013.01); *H05K 3/424* (2013.01); *H05K 3/4682* (2013.01); *H05K 2201/10378* (2013.01); *H05K 2203/0152* (2013.01); *H05K 2203/0733* (2013.01); *Y10T 29/49155* (2015.01)

(58) Field of Classification Search
    CPC ........ H05K 1/113; H05K 3/4647; H05K 3/10; H05K 3/4682; H05K 3/424; H05K 2201/10378; H05K 2203/0733; H05K 2203/0152; Y10T 29/49155
    See application file for complete search history.

(56) References Cited

U.S. PATENT DOCUMENTS

| | | | | |
|---|---|---|---|---|
| 2007/0289127 | A1* | 12/2007 | Hurwitz | H01L 21/4857 29/827 |
| 2008/0136041 | A1* | 6/2008 | Kotake | H05K 3/4038 257/774 |
| 2015/0069623 | A1* | 3/2015 | Tsai | H01L 21/563 257/774 |

* cited by examiner

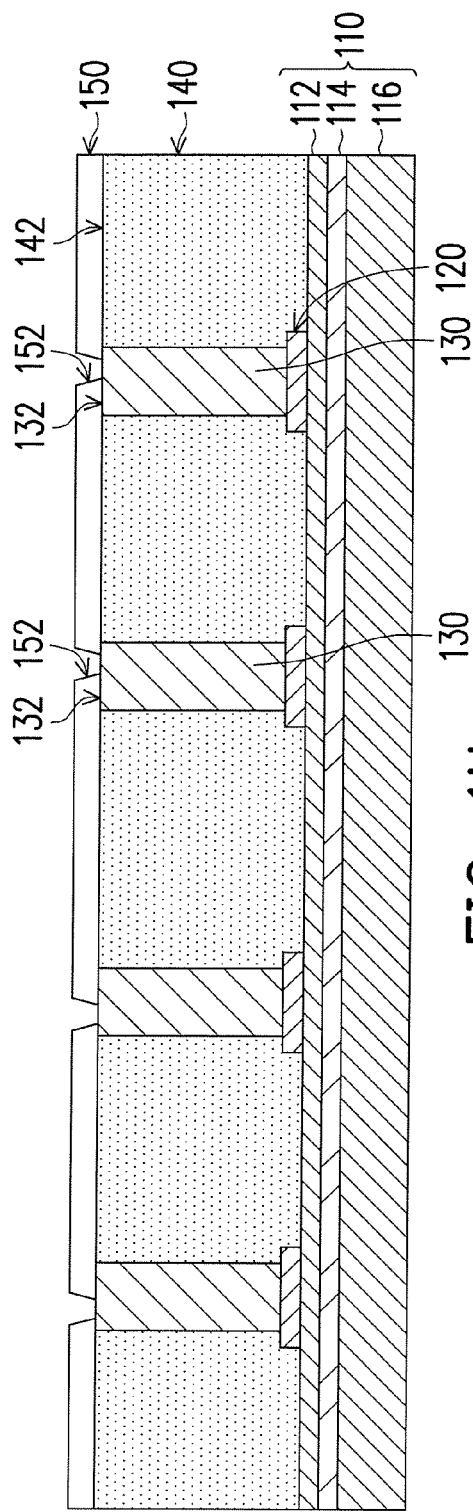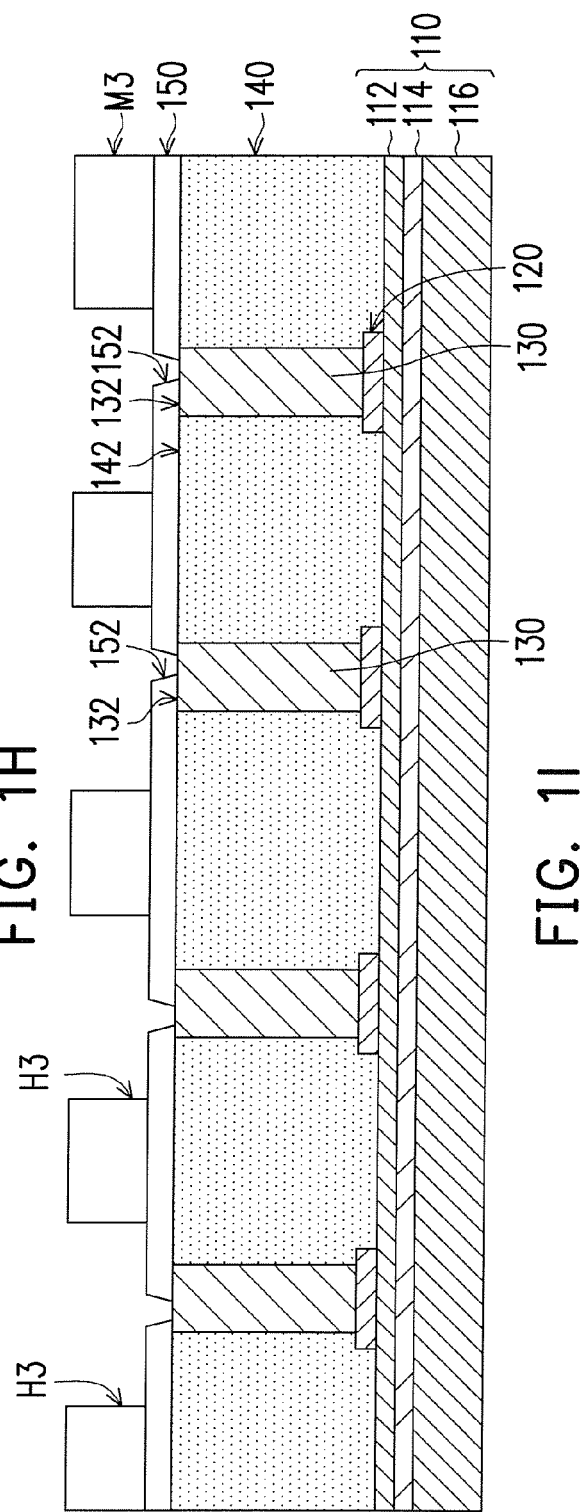
FIG. 1H
FIG. 1I

MANUFACTURING METHOD OF INTERPOSED SUBSTRATE

CROSS-REFERENCE TO RELATED APPLICATION

This application is a divisional application of and claims the priority benefit of U.S. application Ser. No. 14/164,245, filed on Jan. 26, 2014, now allowed. The prior U.S. application Ser. No. 14/164,245 is a continuation-in-part application of and claims the priority benefit of U.S. application Ser. No. 13/543,893, filed on Jul. 9, 2012, which claims the priority benefit of Taiwan application serial no. 101118578, filed on May 24, 2012. The entirety of each of the above-mentioned patent applications is hereby incorporated by reference herein and made a part of specification.

BACKGROUND OF THE INVENTION

Field of the Invention

The invention relates to a manufacturing method of a substrate thereof, and more particularly to, a manufacturing method of an interposed substrate.

Description of Related Art

In the current information society, the design of electronic product is tended towards a trend of lightweight, thin, short, and compactness. As such, the development of various packaging technologies, such as the stack-type semiconductor device packaging technology, facilitates a miniaturization of the semiconductor package. In a stacked-type semiconductor device package, a plurality of semiconductor devices is vertically stacked and packaged in the same package structure, so as to improve package density and facilitate package miniaturization.

In conventional stacked-type semiconductor device package, through silicon vias (TSV) are often formed within an interposed substrate, wherein a function of the through silicon vias is to manufacture a vertical conductive role between chip to chip or wafer to wafer. As for producing the through silicon vias, firstly, vias are formed on a silicon wafer, and then a filling process is performed through electroplating to form the through silicon vias. Afterward, a redistribution circuit layer and a plurality of bumps are also formed on the interposed substrate, so that the interposed substrate may be smoothly bonded to a carrier substrate.

Nevertheless, a material of the interposed substrate is a silicon wafer, and thus a required cost is higher. In addition, the through silicon vias are often formed along with components on a semiconductor wafer; therefore, in order to avoid a conductive material from entering an active area in the circuit of a silicon wafer, mostly, a passivation layer is firstly formed on the silicon wafer and on the interior wall of the vias, and after the manufacture of the through silicon vias is completed, the passivation layer is then removed to isolate the through silicon vias from the other components. However, the aforementioned production process is much complicated.

SUMMARY OF THE INVENTION

The invention provides a manufacturing method of an interposed substrate to manufacture the interposed substrate, which may reduce the damages to the patterned conductor layer caused by etching agents, and has a favorable structure and electrical reliability.

The invention provides a manufacturing method of an interposed substrate including the following steps. A metal-stacked layer is formed, wherein the metal-stacked layer comprises a first metal layer, an etching stop layer and a second metal layer. The etching stop layer is disposed between the first metal layer and the second metal layer, and a thickness of the second metal layer is greater than a thickness of the first metal layer. A patterned conductor layer is formed on the first metal layer, wherein the patterned conductor layer exposes a portion of the first metal layer. A plurality of conductive pillars is formed on the patterned conductor layer, wherein the conductive pillars are separated from each other and stacked on a portion of the patterned conductor layer. An insulating material layer is formed on the metal-stacked layer, and the insulating layer has an upper surface and a lower surface opposite to each other, wherein the insulating material layer covers the portion of the first metal layer and encapsulates the conductive pillars and the other portion of the patterned conductor layer. The metal-stacked layer is removed to expose the lower surface of the insulating material layer and a bottom surface of the patterned conductor layer.

The invention further provides an interposed substrate including an insulating material layer, a plurality of conductive pillars and a patterned conductor layer. The insulating material layer has an upper surface and a lower surface opposite to each other, and a plurality of first through holes and a plurality of second through holes. The first through holes and the second through holes penetrate through the insulating material layer, and a diameter of each of the first through holes is smaller than a diameter of each of the second through holes. The conductive pillars are respectively disposed within the first thorough holes of the insulating material layer. Each conductive pillar has a top surface and a bottom surface opposite to each other. The top surface of each conductive pillar and the upper surface of the insulating material layer are coplanar. The patterned conductor layer is disposed within the second through holes of the insulating material layer. The conductive pillars are separated from each other and stacked on the patterned conductor layer, and a bottom surface of the patterned conductor layer and the lower surface of the insulating material layer are not aligned.

According to the foregoing, the manufacture of the interposed substrate of the invention forms the conductive pillars through utilizing the patterned conductor layer disposed on the metal-stacked layer, subsequently forms the insulating material layer on the metal-stacked layer to cover the conductive pillars and the patterned conductor layer, and then removes the metal-stacked layer to expose the lower surface of the insulating material layer and the bottom surface of the patterned conductor layer. Consequently, in comparison to the conventional technique of manufacturing the interposed substrate using a silicon wafer, the interposed substrate of the invention requires neither the silicon wafer nor an additional fabrication of an insulating layer, and is therefore capable of effectively reducing a manufacture cost and having relatively simple manufacture steps.

Furthermore, since the conductive pillars and the patterned conductor layer are covered by the insulating material layer, such that no electrical leakage problem would occur even through without the additional fabrication of the insulating layer, the interposed substrate of the invention may have favorable electrical reliability. In addition, the metal-stacked layer includes the etching stop layer, and thus when the metal-stacked layer is removed, the damages caused by etching agents to the bottom surface of the patterned conductor layer can be reduced, so that the interposed substrate of the invention may have favorable structure reliability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1M are schematic cross-sectional views illustrating a manufacturing method of an interposed substrate according to an embodiment.

DETAILED DESCRIPTION OF DISCLOSED EMBODIMENTS

Figure 1A:
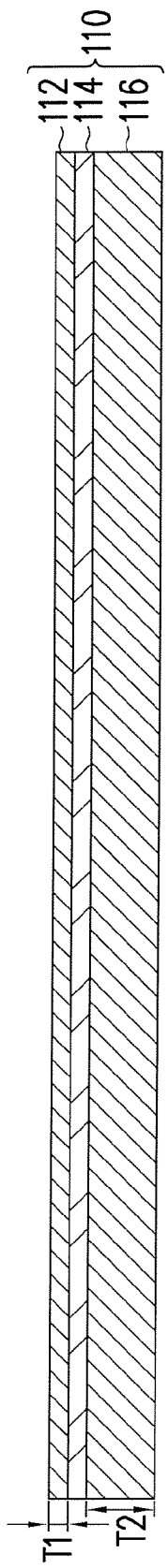

FIG. 1A to FIG. 1M are schematic cross-sectional views illustrating a manufacturing method of an interposed substrate according to an embodiment. According to the manufacturing method of the interposed substrate in the present embodiment, firstly, referring to FIG. 1A, a metal-stacked layer 110 is formed, wherein the metal-stacked layer 110 includes a first metal layer 112, an etching stop layer 114 and a second metal layer 116. Herein, the etching stop layer 116 is disposed between the first metal layer 112 and the second metal layer 114, and a thickness T2 of the second metal layer 116 is greater than a thickness T1 of the first metal layer 112.

More specifically, in the present embodiment, a step of forming the metal-stacked layer 110 includes the following steps. The second metal layer 116 is provided firstly, wherein a material of the second metal layer 116 is, for example, copper, aluminum, gold, nickel, titanium or tungsten. And then, the etching stop layer 114 is plated on the second metal layer 116, wherein the etching stop layer 114 entirely covers the second metal layer 114, and a material of the etching stop layer 114 is, for example, nickel, gold, titanium, aluminum, copper, tin or tungsten. Finally, the first metal layer 112 is plated on the etching stop layer 114, wherein the first metal layer 112 entirely covers the etching stop layer 114, and a material of the first metal layer 112 is, for example, copper, aluminum, gold, nickel, titanium or tungsten.

Figure 1B:
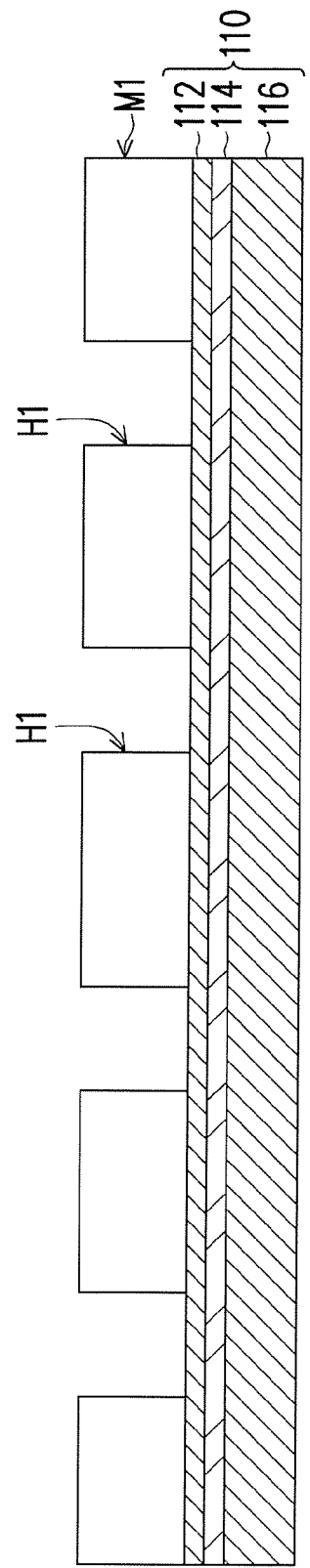

Next, referring to FIG. 1B, a photoresist layer M1 is formed on the metal-stacked layer 110, wherein the photoresist layer M1 covers a portion of the first metal layer 112 and has a plurality of openings H1, and the other portion of the first metal layer 112 is exposed by the openings H1.

Figure 1C:
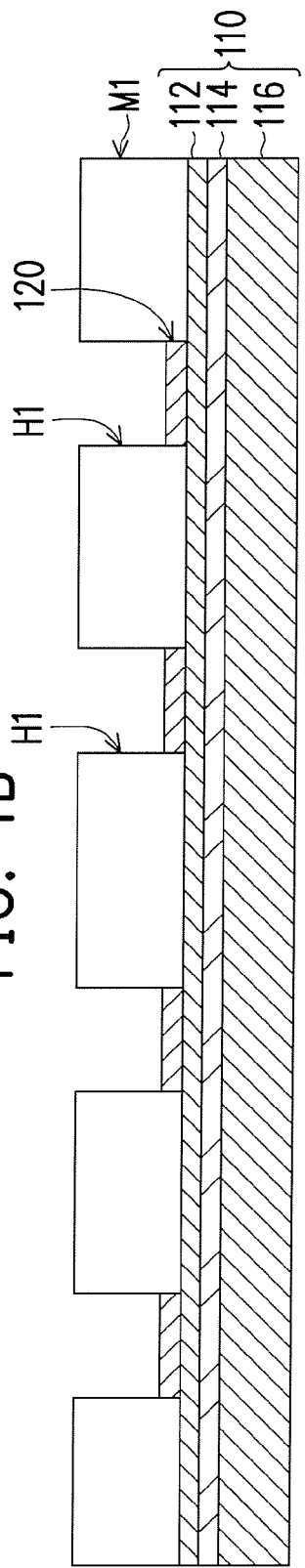

Next, referring to FIG. 1C, a patterned conductor layer 120 is formed on the first metal layer 112, wherein the patterned conductor layer 120 is electroplated at the other portion of the first metal layer 112 exposed by the openings H1 through utilizing the photoresist layer M1 as an electroplating mask. Herein, a material of the patterned conductor layer is, for example copper, nickel or gold.

Figure 1D:
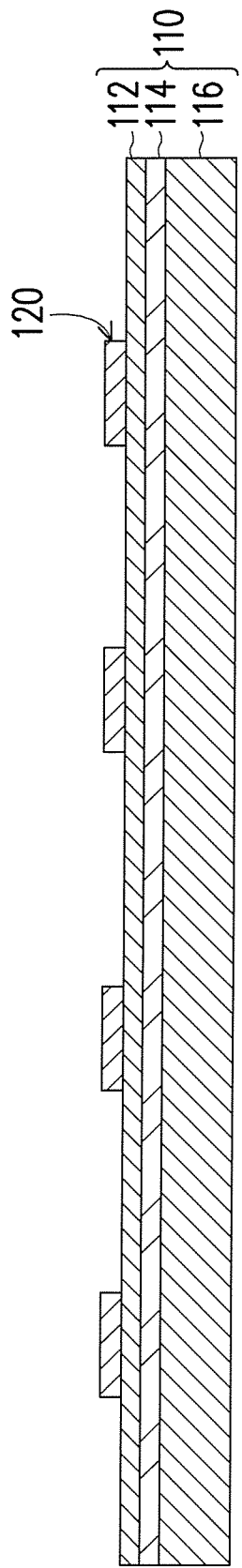

Next, referring to FIG. 1D, the photoresist layer M1 is removed to expose the portion of the first metal layer 112.

Figure 1E:
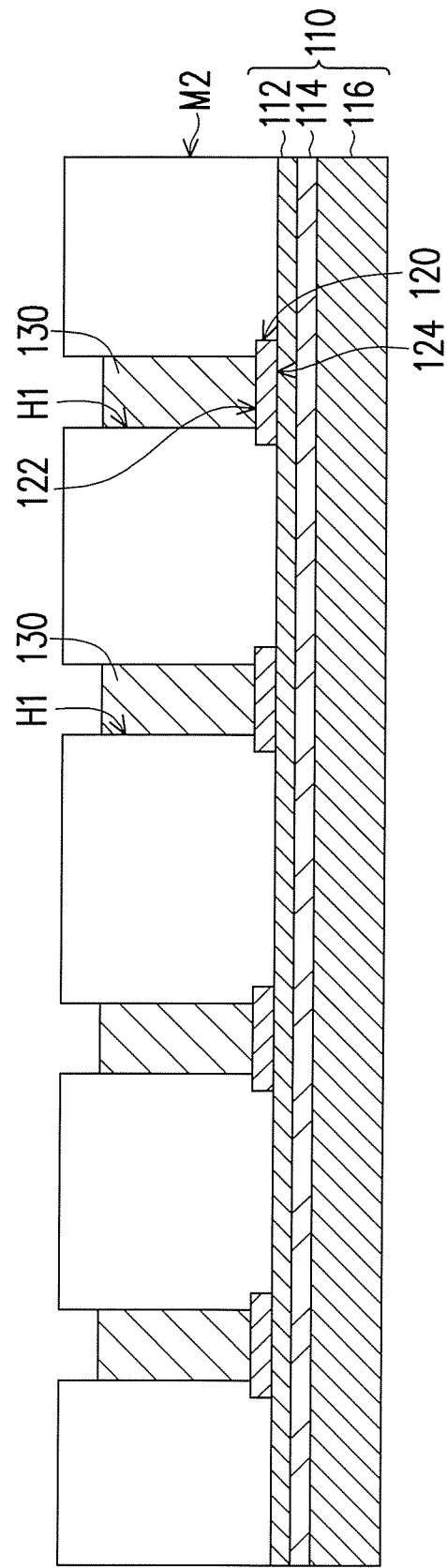

Next, referring to FIG. 1E, a photoresist layer M2 is formed on the metal-stacked layer 110, wherein the photoresist layer M2 covers the portion of the first metal layer 112 and has a plurality of openings H2, and the portion of the patterned conductor layer 120 is exposed by the openings H2. And then, still referring to FIG. 1E, the conductive pillars 130 are electroplated in the openings H2 through utilizing the photoresist layer M2 as an electroplating mask, wherein the conductive pillars 130 are separated from each other and stacked on a portion of the patterned conductor layer 120, and a material of the conductive pillars 130 is, for example copper, nickel or gold. Specifically, an orthogonal projection area of each of the conductive pillars 130 on an upper surface 122 opposite to the bottom surface 124 of the patterned conductor layer 120 is overlapped with and smaller than a surface area of the upper surface 122 of the patterned conductor layer 120.

Figure 1F:
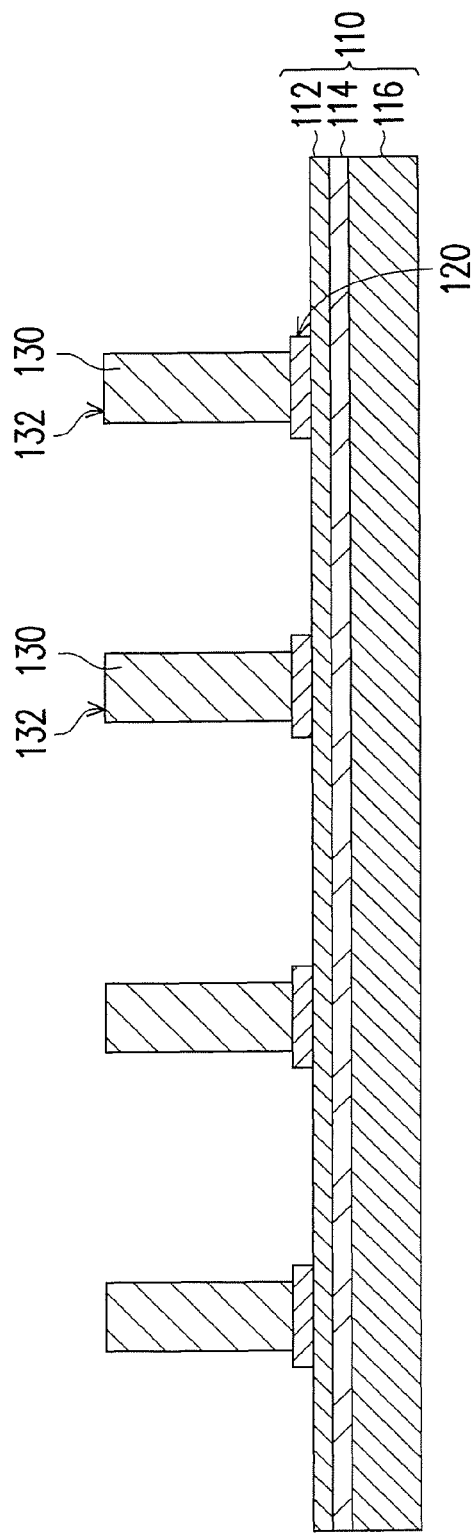

Next, referring to FIG. 1F, the photoresist layer M2 is removed to expose the portion of the first metal layer 112.

Figure 1G:
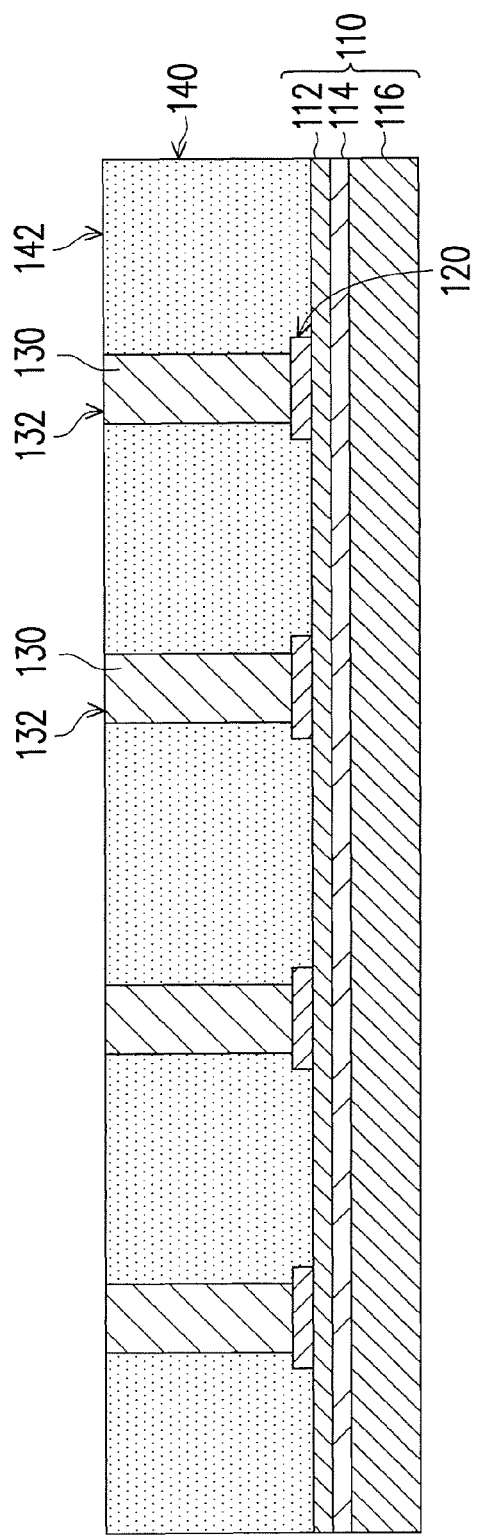

Next, referring to FIG. 1G, an insulating material layer 140 is formed on the metal-stacked layer 110 through a thermal pressing process, wherein the insulating material layer 140 covers the portion of the first metal layer 112 and encapsulates the conductive pillars 130 and the other portion of the patterned conductor layer 120. Herein, an upper surface 142 of the insulating material layer 140 and a top surface 132 of each conductive pillar 130 are coplanar. A material of the insulating material layer 140 is, for example, molding compound, ajinomoto build-up film (ABF) resin or silicon dioxide ($SiO_2$).

Next, referring to FIG. 1H, a dielectric layer 150 is formed on the insulating material layer 140 after the insulating material layer 140 is formed on the metal-stacked layer 110, wherein the dielectric layer 150 covers the upper surface 142 of the insulating material layer 140 and the top surface 132 of each conductive pillar 130. Herein, a thickness T4 of the dielectric layer 150 is smaller than a thickness T3 of the insulating material 140. And then, still referring to FIG. 1H, a plurality of through vias 152 is formed, such that the through vias 152 penetrate through the dielectric layer 150 and respectively expose a portion of the top surface 132 of each conductive pillar 130.

Next, referring to FIG. 1I, a photoresist layer M3 is formed on the dielectric layer 150, wherein the photoresist layer M3 covers a portion of the dielectric layer 150 and has a plurality of openings H3, and the other portion of the dielectric layer 150 and the through vias 152 are exposed by the openings H3.

Figure 1J:
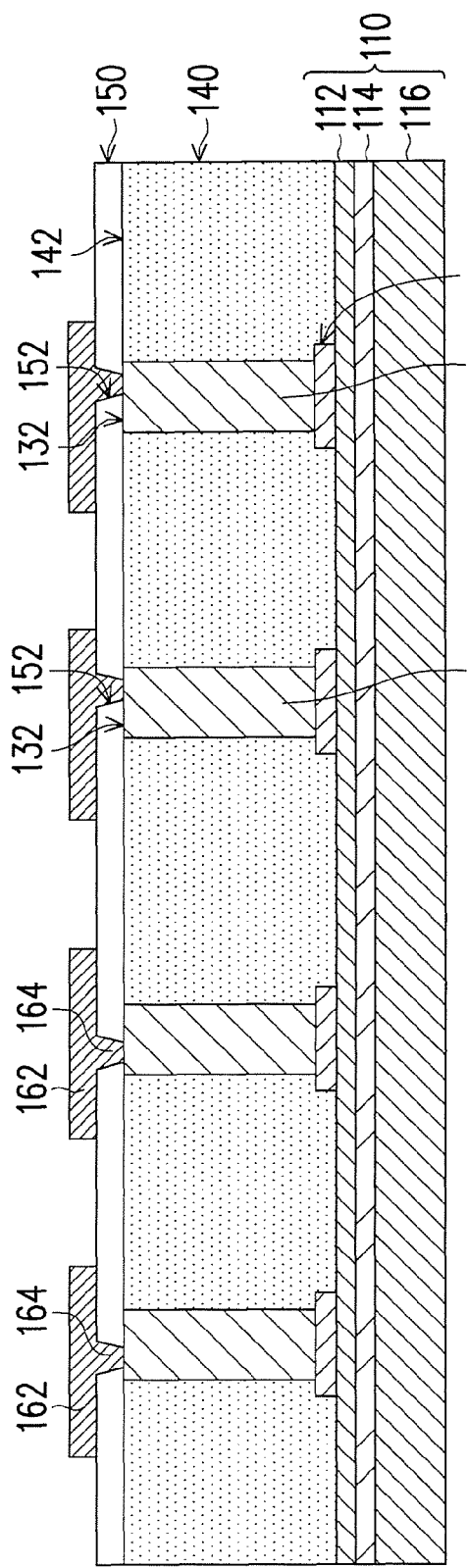

Next, referring to FIG. 1I and FIG. 1J, a redistribution layer is electroplated at the other portion of the dielectric layer 150 exposed by the openings H3 through utilizing the photoresist layer M3 as an electroplating mask, wherein the redistribution layer includes a plurality of pads 162 disposed on the dielectric layer 150 and a plurality of conductive through vias 164 respectively located in the through vias 152. In the present embodiment, the pads 162 respectively connect the conductive through vias 164 and electrically connect with the conductive pillars 130 through the conductive through vias 164. Herein, a material of the redistribution layer is, for example, copper, nickel or gold.

Next, still referring to FIG. 1J, the photoresist layer M3 is removed to expose the portion of the dielectric layer 150.

Figure 1K:
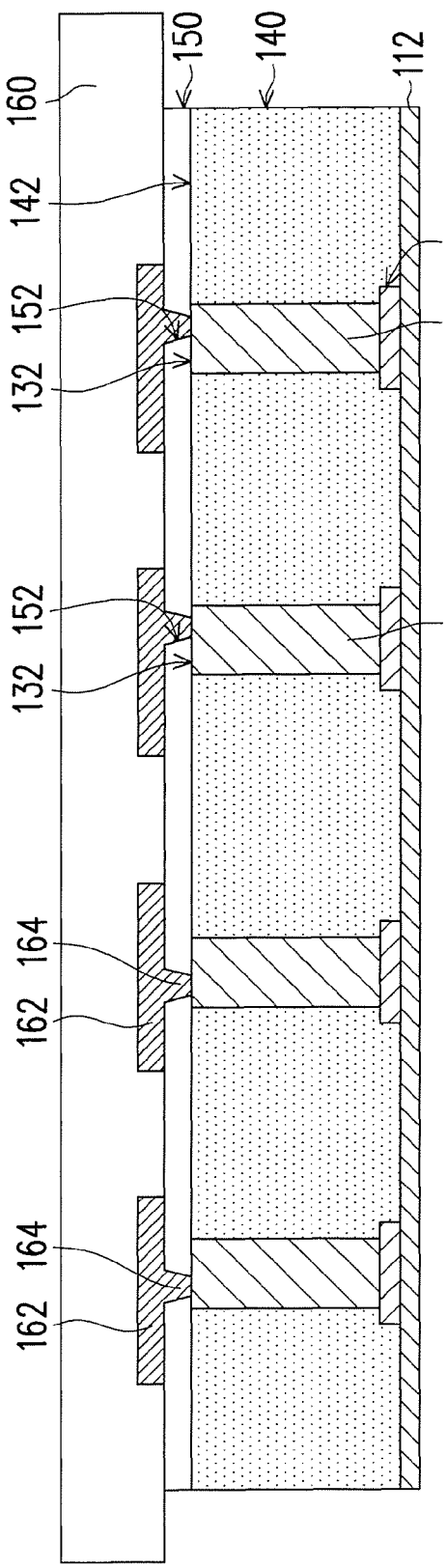

Next, referring to FIG. 1K, a passivation layer 160 is formed on the dielectric layer 150, wherein the passivation layer 160 covers the pads 162 and the portion of the dielectric layer 150 for protecting the pads 162 from being etched by etchant in the subsequent processes. And then, still referring to FIG. 1K, a first etching process is performed to totally remove the second metal layer 116, so as to expose the etching stop layer 114, and then, a second etching process is performed to totally remove the etching stop layer 114, so as to expose the first metal layer 112.

Figure 1L:
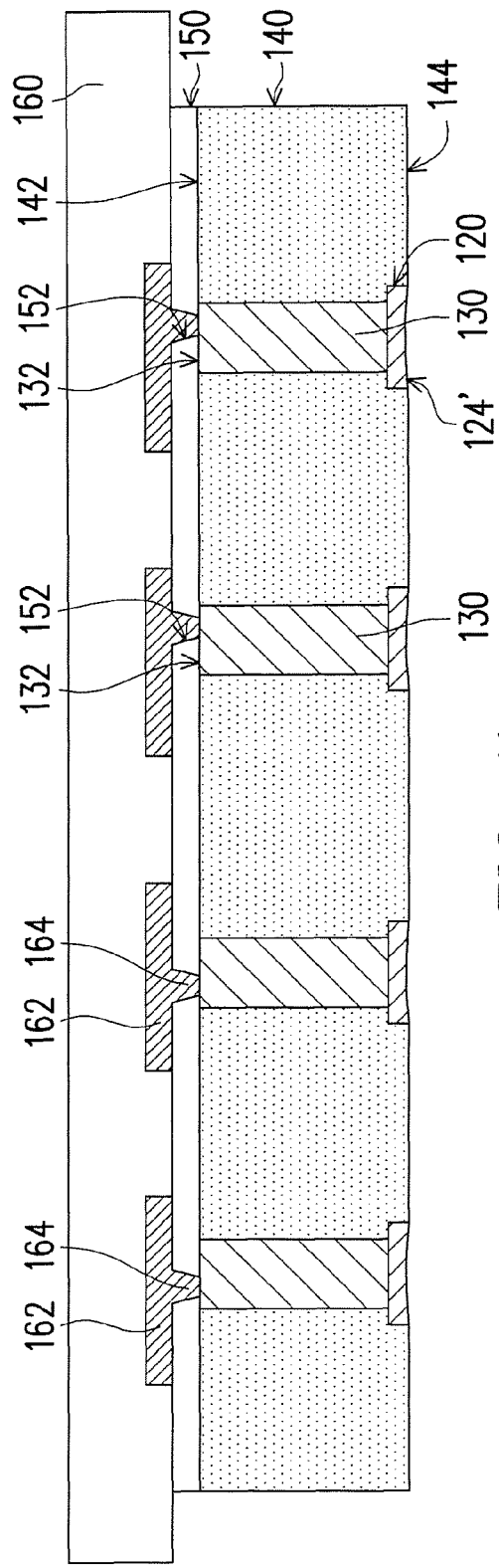

Next, referring to FIG. 1K and FIG. 1L, a third etching process is performed to totally remove the first metal layer 112, so as to expose a lower surface 144 opposite to the upper surface 142 of the insulating material layer 140 and a bottom surface 124' of the patterned conductor layer 120. Herein, an etching time of the first etching process is substantially greater than that of the third etching process. At this point, removing the metal-stacked layer 110 to expose the lower surface 144 of the insulating material layer 140 and the bottom surface 124' of the patterned conductor layer 120 is completed. Specifically, the lower surface 144 of the insulating material layer 140 and the bottom surface 124' of patterned conductor layer 120 are not aligned.

Figure 1M:
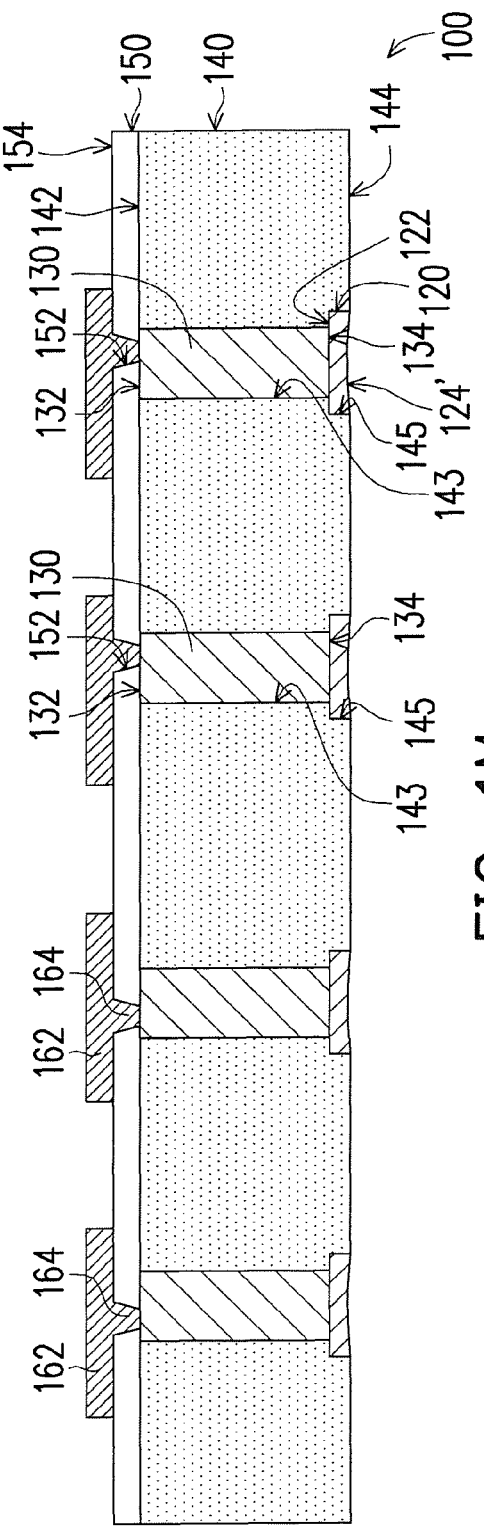

After, referring to FIG. 1L and FIG. 1M, the passivation layer 160 is removed to expose the pads 162 and the portion of the dielectric layer 150. At this point, the manufacture of the interposed substrate 100 is completed.

Structurally, referring to FIG. 1M again, the interposed substrate 100 of the present embodiment includes the insulating material layer 140, the conductive pillars 130 and the patterned conductor layer 120. The insulating material layer 140 has the upper surface 142 and the lower surface 144 opposite to each other and a plurality of first through holes 143 and a plurality of second through holes 145 connected to each other. Herein, the first through holes 143 and the second through holes 145 penetrate through the insulating material layer 140, and a diameter of each of the first through holes 143 is smaller than a diameter of each of the second through holes 145. The conductive pillars 130 are respectively disposed within the first through holes 143 of the insulating material layer 140, and the conductive pillars 130 have the top surfaces 132 and the bottom surfaces 134 opposite to each other. The top surfaces 132 of the conductive pillars 130 and the upper surface 142 of the insulating material layer 140 are substantially coplanar. The patterned conductor layer 120 are respectively disposed within the second through holes 145 of the insulating material layer 140, wherein the conductive pillars 130 are separated from each other and stacked on the patterned conductor layer 120, and the bottom surface 124' of the patterned conductor layer 120 and the lower surface 144 of the insulating material layer 140 are not aligned. Specifically, the orthogonal projection area of each of the conductive pillars 130 on the upper surface 122 of the patterned conductor layer 120 is overlapped with and smaller than a surface area of the upper surface 122 of the patterned conductor layer 120. Herein, a material of the conductive pillars 130 and a material of the patterned conductor layer 120 are, for example, copper, nickel or gold.

Furthermore, the interposed substrate 100 further includes the dielectric layer 150, the conductive through vias 164 and the pads 162. The dielectric layer 150 is disposed on the upper surface 142 of the insulating material layer 140, wherein the dielectric layer 150 covers the upper surface 142 of the insulating material layer 140 and the top surfaces 132 of the conductive pillars 130. The conductive through vias 164 penetrate through the dielectric layer 150 and respectively connecting the top surfaces 132 of the conductive pillars 130. The pads 162 are disposed on the dielectric layer 150 and connect the conductive through vias 164, wherein the pads 162 are electrically connect with the conductive pillars 130 through the conductive through vias 164, and the pads 162 and the conductive through vias 164 define the redistribution layer. Herein, an orthogonal projection area of each of the pads 162 on an upper surface 154 of the dielectric layer 150 is overlapped with and greater than an orthogonal projection area of each of the conductive pillars 130 on the upper surface 154 of the dielectric layer 150.

Since the manufacture of the interposed substrate 100 of the present embodiment manufactures the conductive pillars 130 through utilizing the metal trace 120 disposed on the metal-stacked layer 110, subsequently forms the insulating material layer 140 on the metal-stacked layer 110 to cover the conductive pillars 130, and then removes the metal-stacked layer 110 to expose the lower surface 144 of the insulating material layer 140 and the bottom surface 124' of the patterned conductor layer 120, in comparison to the conventional technique of manufacturing the interposed substrate using a silicon wafer, the interposed substrate 100 of the present embodiment requires neither the silicon wafer nor an additional fabrication of an insulating layer, and is therefore capable of effectively reducing a manufacture cost and having relatively simple manufacture steps.

Furthermore, since the conductive pillars 130 and the patterned conductor layer 120 are covered by the insulating material layer 140, such that no electrical leakage problem would occur even through without the additional fabrication of the insulating layer, the interposed substrate 100 of the present embodiment may have favorable electrical reliability. In addition, the metal-stacked layer 110 includes the etching stop layer 114, and thus when the metal-stacked layer 110 is removed, the damages caused by etching agents to the bottom surface 124' of the patterned conductor layer 120 can be reduced, so that the interposed substrate 100 of the present embodiment may have favorable structure reliability.

In summary, the manufacture of the interposed substrate of the invention forms the conductive pillars through utilizing the patterned conductor layer disposed on the metal-stacked layer, subsequently forms the insulating material layer on the metal-stacked layer to cover the conductive pillars and the patterned conductor layer, and then removes the metal-stacked layer to expose the lower surface of the insulating material layer and the bottom surface of the patterned conductor layer. Consequently, in comparison to the conventional technique of manufacturing the interposed substrate using a silicon wafer, the interposed substrate of the invention requires neither the silicon wafer nor an additional fabrication of an insulating layer, and is therefore capable of effectively reducing a manufacture cost and having relatively simple manufacture steps.

Furthermore, since the conductive pillars and the patterned conductor layer are covered by the insulating material layer, such that no electrical leakage problem would occur even through without the additional fabrication of the insulating layer, the interposed substrate of the invention may have favorable electrical reliability. In addition, the metal-stacked layer includes the etching stop layer, and thus when the metal-stacked layer is removed, the damages caused by etching agents to the bottom surface of the patterned conductor layer can be reduced, so that the interposed substrate of the invention may have favorable structure reliability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of an interposed substrate comprising:

forming a metal-stacked layer, wherein the metal-stacked layer comprises a first metal layer, an etching stop layer and a second metal layer, the etching stop layer is disposed between the first metal layer and the second metal layer, and a thickness of the second metal layer is greater than a thickness of the first metal layer;

forming a patterned conductor layer on the first metal layer, wherein the patterned conductor layer exposes a portion of the first metal layer;

forming a plurality of conductive pillars on the patterned conductor layer, wherein the conductive pillars are separated from each other and stacked on a portion of the patterned conductor layer;

forming an insulating material layer on the metal-stacked layer, the insulating material layer having an upper surface and a lower surface opposite to each other, wherein the insulating material layer covers the portion of the first metal layer and encapsulates the conductive pillars and the other portion of the patterned conductor layer;

forming a dielectric layer on the insulating material layer, wherein the dielectric layer covers the upper surface of the insulating material layer and a top surface of each conductive pillar; and removing the metal-stacked layer to expose the lower surface of the insulating material layer and a bottom surface of the patterned conductor layer.

2. The manufacturing method of the interposed substrate a recited in claim 1, wherein a step of forming the metal-stacked layer comprises:

providing the second metal layer;

plating the etching stop layer on the second metal layer, wherein the etching stop layer covers the second metal layer; and plating the first metal layer on the etching stop layer, wherein the first metal layer covers the etching stop layer.

3. The manufacturing method of the interposed substrate a recited in claim 1, wherein a material of the first metal layer comprises copper, aluminum, gold, nickel, titanium or tungsten, a material of the second metal layer comprises copper, aluminum, gold, nickel, titanium or tungsten, and a material of the etching stop layer comprises nickel, gold, titanium, aluminum, copper, tin or tungsten.

4. The manufacturing method of the interposed substrate a recited in claim 1, wherein a step of forming the patterned conductor layer comprises:

forming a photoresist layer on the metal-stacked layer, wherein the photoresist layer covers the portion of the first metal layer and has a plurality of openings, and the other portion of the first metal layer is exposed by the openings;

electroplating the patterned conductor layer at the other portion of the first metal layer exposed by the openings through utilizing the photoresist layer as an electroplating mask; and removing the photoresist layer to expose the portion of the first metal layer.

5. The manufacturing method of the interposed substrate as recited in claim 1, wherein a material of the patterned conductor layer comprises copper, nickel or gold.

6. The manufacturing method of the interposed substrate as recited in claim 1, wherein a step of forming the conductive pillars comprises:

forming a photoresist layer on the metal-stacked layer, wherein the photoresist layer covers the portion of the first metal layer and has a plurality of openings, and the portion of the patterned conductor layer is exposed by the openings;

electroplating the conductive pillars in the openings through utilizing the photoresist layer as an electroplating mask; and removing the photoresist layer to expose the portion of the first metal layer.

7. The manufacturing method of the interposed substrate as recited in claim 1, wherein a material of the conductive pillars comprises copper, nickel or gold.

8. The manufacturing method of the interposed substrate as recited in claim 1, wherein a step of forming the insulating material layer comprises:

forming the insulating material layer on the metal-stacked layer through a thermal pressing process, wherein the upper surface of the insulating material layer and a top surface of each conductive pillar are coplanar.

9. The manufacturing method of the interposed substrate as recited in claim 1, wherein a material of the insulating material layer comprises molding compound, ajinomoto build-up film resin or silicon dioxide.

10. The manufacturing method of the interposed substrate as recited in claim 1 further comprising:

forming a plurality of through vias, such that the through vias penetrate through the dielectric layer and respectively expose a portion of the top surface of each conductive pillar;

forming a photoresist layer on the dielectric layer, wherein the photoresist layer covers a portion of the dielectric layer and has a plurality of openings, and the other portion of the dielectric layer and the through vias are exposed by the openings;

electroplating a redistribution layer at the other portion of the dielectric layer exposed by the openings through utilizing the photoresist layer as an electroplating mask, wherein the redistribution layer comprises a plurality of pads disposed on the dielectric layer and a plurality of conductive through vias respectively located in the through vias, the pads respectively connect the conductive through vias and electrically connect with the conductive pillars through the conductive through vias; and removing the photoresist layer to expose the portion of the dielectric layer.

11. The manufacturing method of the interposed substrate as recited in claim 1, wherein after the metal-stacked layer is removed, the lower surface of the insulating material layer and the bottom surface of the patterned conductor layer are not aligned.

12. The manufacturing method of the interposed substrate as recited in claim 1, wherein a step of removing the metal-stacked layer comprises:

performing a first etching process to totally remove the second metal layer, so as to expose the etching stop layer;

performing a second etching process to totally remove the etching stop layer, so as to expose the first metal layer; and performing a third etching process to totally remove the first metal layer, so as to expose the lower surface of the insulating material layer and the bottom surface of the patterned conductor layer, wherein an etching time of the first etching process is substantially greater than that of the third etching process.

13. The manufacturing method of the interposed substrate as recited in claim 1, wherein an orthogonal projection area of each of the conductive pillars on an upper surface opposite to the bottom surface of the patterned conductor layer is overlapped with and smaller than a surface area of the upper surface of the patterned conductor layer.

* * * * *